US007727913B2

(12) United States Patent
Shimoto et al.

(10) Patent No.: US 7,727,913 B2
(45) Date of Patent: Jun. 1, 2010

(54) METHOD OF CRYSTALLIZING SEMICONDUCTOR FILM

(75) Inventors: Shigeyuki Shimoto, Konosu (JP); Takashi Ono, Hadano (JP); Kazufumi Azuma, Yokohama (JP); Masakiyo Matsumura, Kamakura (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 56 days.

(21) Appl. No.: 12/202,651

(22) Filed: Sep. 2, 2008

(65) Prior Publication Data

US 2009/0061603 A1 Mar. 5, 2009

(30) Foreign Application Priority Data

Sep. 3, 2007 (JP) .............................. 2007-228128

(51) Int. Cl.
*H01L 21/00* (2006.01)
(52) U.S. Cl. ........................ 438/795; 438/487; 438/166; 117/201
(58) Field of Classification Search ................. 438/795, 438/799, 166, 487; 117/200, 201, 202, 204
See application file for complete search history.

(56) References Cited

U.S. PATENT DOCUMENTS

| 6,322,625 | B2 | 11/2001 | Im |
| 6,961,117 | B2 | 11/2005 | Im |
| 6,964,831 | B2 | 11/2005 | Lin |
| 2005/0189328 | A1* | 9/2005 | Tsao et al. ............. 219/121.65 |
| 2005/0217571 | A1* | 10/2005 | Taniguchi et al. ........... 117/202 |

FOREIGN PATENT DOCUMENTS

| JP | 2006-295097 | 10/2006 |
| WO | WO 02/42847 A1 | 5/2002 |

OTHER PUBLICATIONS

U.S. Appl. No. 12/425,212, filed Apr. 16, 2009, Matsumura, et al.
Wenchang Yeh, et al . "Proposed Sample Structure for Marked Enlargement of Excimer-Laser-Induced Lateral Grain Growth in Si Thin Films" Jpn. J. Appl. Phys. vol. 41, Apr. 2002, pp. 1909-1914.
"Flat-panel display", 1996, pp. 174-176.

* cited by examiner

*Primary Examiner*—Walter L Lindsay, Jr.
*Assistant Examiner*—Reema Patel
(74) *Attorney, Agent, or Firm*—Oblon, Spivak, McClelland, Maier & Neustadt, L.L.P.

(57) ABSTRACT

A method of crystallizing a semiconductor film including splitting a pulse laser beam oscillated from a laser oscillator, and synthesizing the split pulse laser beams after the split pulse laser beams have propagated through optical paths different in optical path length, modulating the synthesized pulse laser beam into a pulse laser beam by a phase modulating element, and irradiating a non-single-crystal film formed on a substrate with the laser beam to crystallize the non-single-crystal film. Splitting the pulse laser beam and synthesizing the split pulse laser beams are performed using at least three optical splitting/synthesizing units arranged in order, and include sequentially splitting one pulse laser beam split by one optical splitting/synthesizing unit by succeeding splitting/synthesizing unit, and synthesizing the other pulse laser beam split by one optical splitting/synthesizing unit with the other pulse laser beam split by preceding splitting/synthesizing unit.

12 Claims, 11 Drawing Sheets

Without pulse waveform control

With pulse waveform control

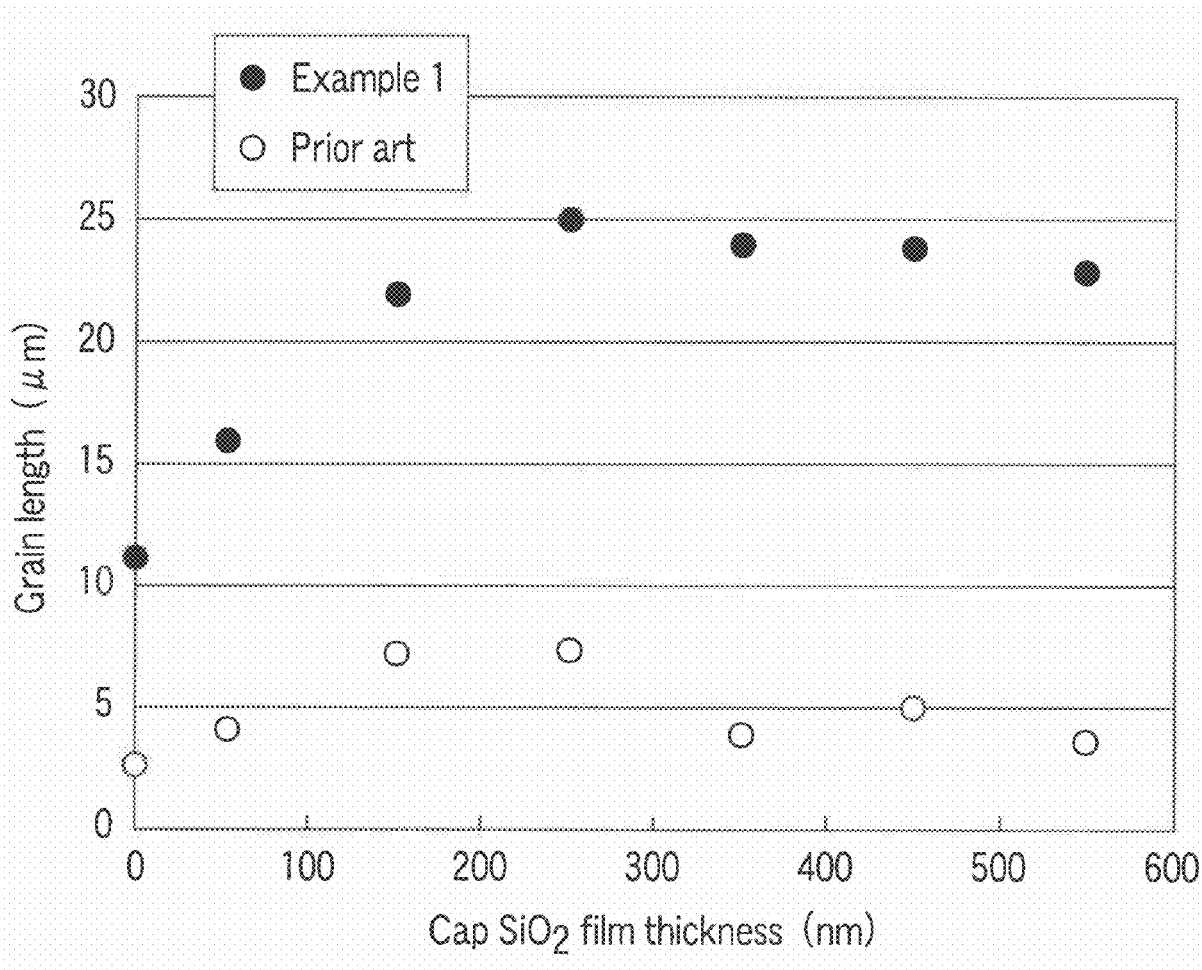
F I G. 6

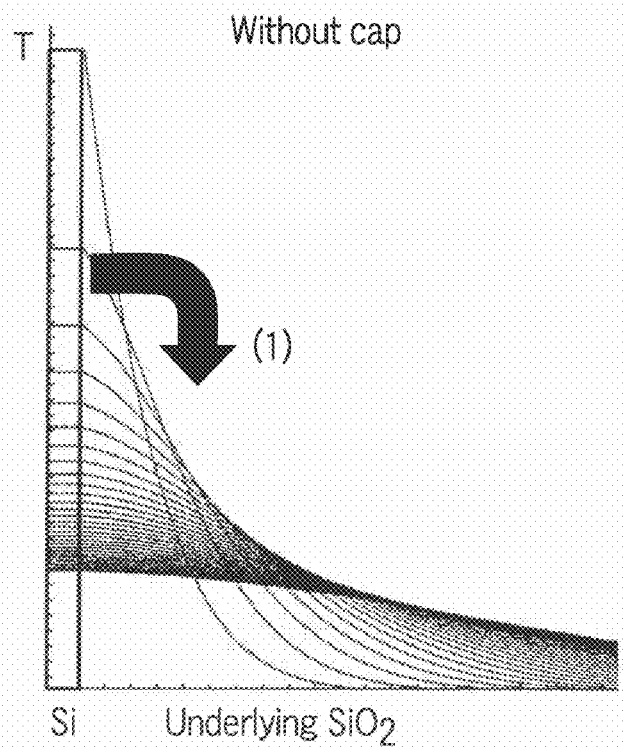
F I G. 10A
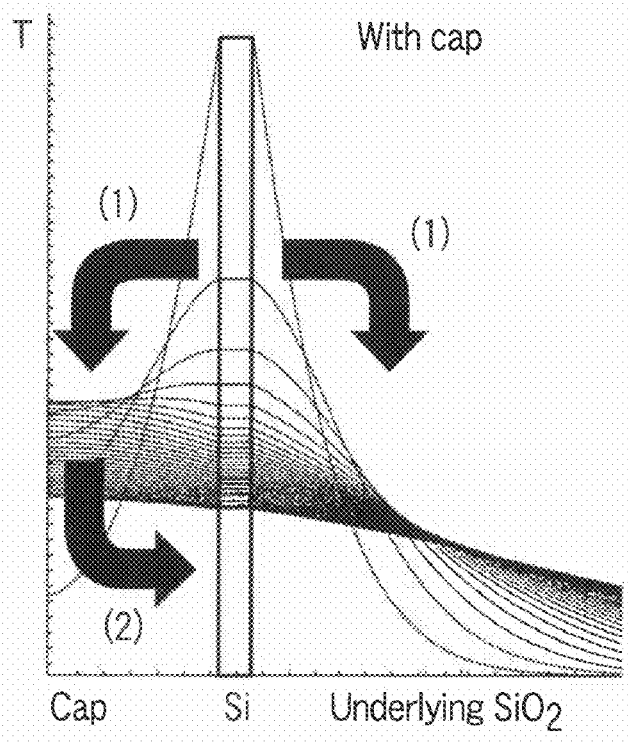
F I G. 10B

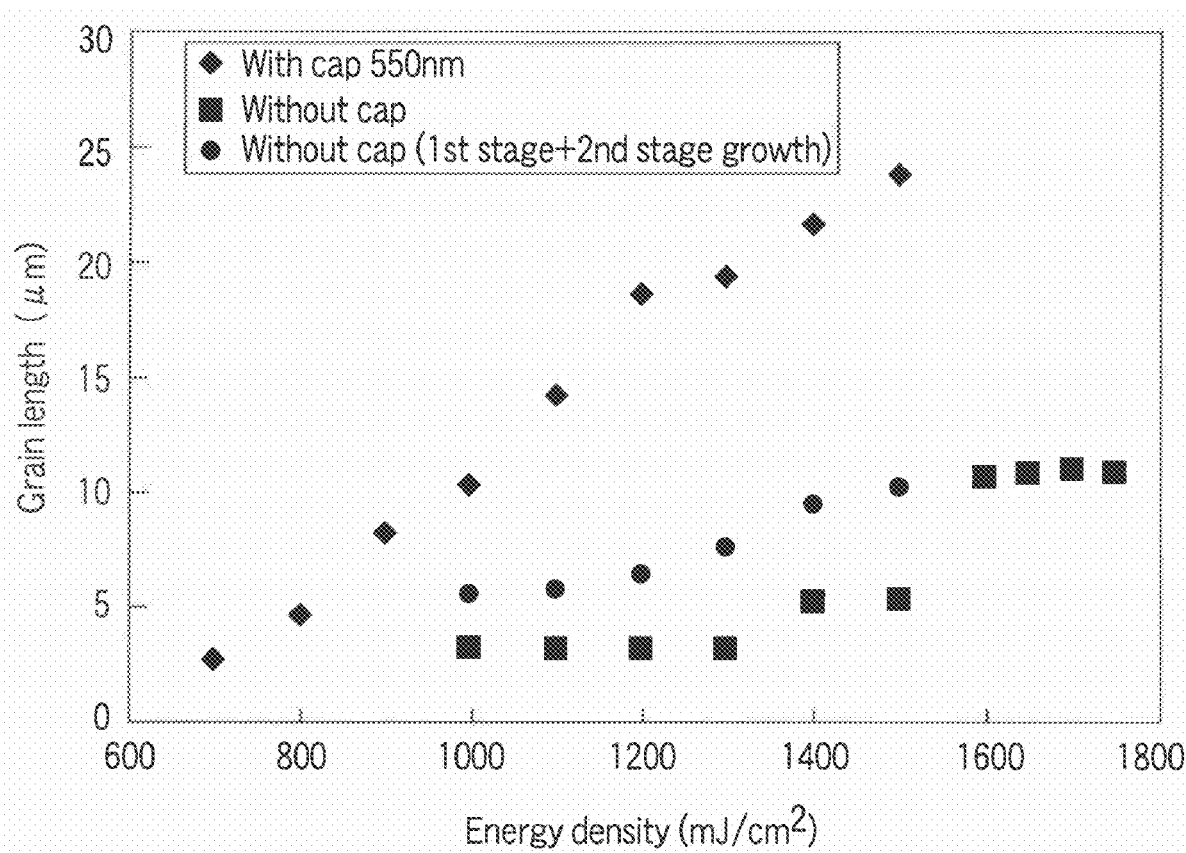
F I G. 11

METHOD OF CRYSTALLIZING SEMICONDUCTOR FILM

CROSS-REFERENCE TO RELATED APPLICATIONS

This application is based upon and claims the benefit of priority from prior Japanese Patent Application No. 2007-228128, filed Sep. 3, 2007, the entire contents of which are incorporated herein by reference.

BACKGROUND OF THE INVENTION

1. Field of the Invention

The present invention relates to a method of crystallizing a semiconductor film and an apparatus of crystallizing a semiconductor film and, more particularly, to a crystallizing method and crystallizing apparatus for forming a crystallized semiconductor film by irradiating a non-single-crystal semiconductor film such as an amorphous silicon film with a pulse laser beam.

2. Description of the Related Art

In a liquid crystal display device (LCD), an organic electroluminescence (organic EL) display device, and the like, a thin film transistor (TFT) is formed as a switching element for each pixel, and TFTs are also used in a driving circuit. When the performance of the TFT improves, e.g., when the mobility increases, the threshold voltage decreases, and the characteristic variation reduces, it is possible to obtain effects of, e.g., increasing the operating speed of the circuit, reducing the power consumption, and improving the image quality. A polysilicon TFT is widely used because its mobility is higher than that of amorphous silicon.

A practical method of forming a thin polysilicon film is excimer laser annealing (ELA), which melts amorphous silicon by irradiating it with an excimer laser beam, thereby crystallizing the irradiated region. In this method, the temperature of a substrate to be processed rises to the melting temperature of amorphous silicon. Since, however, this heating temperature is instantaneous in a narrow region of the substrate, amorphous silicon can be crystallized without thermally damaging the substrate to be processed. This makes it possible to use an inexpensive glass substrate as the substrate to be processed, and form polysilicon grains having a grain size of about 0.1 to 1 µm.

When a TFT is formed in the thin polysilicon film thus obtained, the channel region of the TFT contains a large number of grain boundaries. Consequently, the mobility becomes about 100 to 200 $cm^2/Vs$ which is greatly inferior to that of a MOS transistor formed in single-crystal Si.

The present inventors previously developed the industrial technique of irradiating an amorphous silicon layer with a laser beam, thereby forming large crystal grains capable of forming a channel portion of at least one thin film transistor. Unlike the conventional transistor in which grain boundaries are formed in the channel region, forming a TFT in a single crystal grain has no adverse effect of grain boundaries, and greatly improves the TFT characteristics. As crystallizing methods like this, the present inventors proposed crystallizing methods described in, e.g., W. Yeh and M. Matsumura Jpn. Appl. Phys. Vol. 41(2002)1909 and JP-A 2006-295097.

The former non-patent reference describes a method of crystallizing an amorphous silicon film by irradiating it with a phase-modulated laser beam having a fluence of 0.8 $J/cm^2$ through a $SiON/SiO_2$ cap film or a $SiO_2$ cap film, thereby laterally growing crystal grains parallel to the film.

The latter patent reference describes a method of laterally crystallizing an amorphous silicon film by irradiating it with a phase-modulated laser beam by using, as a cap film, a $SiO_x$ film (x is less than 2), which is non-stoichiometric silicon oxide having light absorption characteristics.

Unfortunately, when the light-transmitting $SiO_2$ cap film is used in the method of the non-patent reference, the cap film itself does not generate heat and has an effect of suppressing cooling of the silicon layer, but the effect is unsatisfactory. Consequently, the crystal growth time cannot be prolonged because the temperature suited to crystal growth cannot be maintained. As a result, the grain size of the obtained crystal texture is not large.

Also, when the light-absorbing SiON or $SiO_x$ cap film described in the non-patent reference or patent reference is used, the light absorption spectrum changes if the ratio of oxygen atoms to nitrogen atoms or the ratio of silicon atoms to oxygen atoms in the film changes. That is, a slight change in film formation conditions largely changes the absorption characteristics. This causes crystal grain variations between substrates or in the surface of a substrate, and allows easy occurrence of defects such as a defective circuit operation and uneven display.

Furthermore, when an excimer laser is used as a heating light source in either method, the temperature of a silicon film abruptly decreases after irradiation with the laser beam, because the pulse width of the laser beam is small, i.e., the heating time is short. This makes it impossible to greatly increase the crystal growth time.

BRIEF SUMMARY OF THE INVENTION

It is an object of the present invention to provide a method of crystallizing a semiconductor film and an apparatus of crystallizing a semiconductor film, capable of obtaining crystal grains having a large grain size by greatly extending the crystal growth time.

According to the first aspect of the present invention, there is provided a method of crystallizing a semiconductor film comprising splitting a pulse laser beam oscillated from a laser oscillator, and synthesizing the split pulse laser beams after the split pulse laser beams have propagated through optical paths different in optical path length; modulating the synthesized pulse laser beam into a pulse laser beam by a phase modulating element; and irradiating a non-single-crystal film formed on a substrate with the laser beam to crystallize the non-single-crystal film, wherein splitting the pulse laser beam and synthesizing the split pulse laser beams are performed using at least three optical splitting/synthesizing means arranged in order, and include sequentially splitting one pulse laser beam split by one optical splitting/synthesizing means by succeeding splitting/synthesizing means, and synthesizing the other pulse laser beam split by one optical splitting/synthesizing means with the other pulse laser beam split by preceding splitting/synthesizing means.

According to the second aspect of the present invention, there is provided a apparatus of crystallizing a semiconductor film comprising a laser oscillator which oscillates a pulse laser beam; optical splitting/synthesizing means for splitting the oscillated pulse laser beam, and synthesizing the split pulse laser beams after the split pulse laser beams have propagated through optical paths different in optical path length; a phase modulating element which modulates the synthesized pulse laser beam into a pulse laser beam having a predetermined light intensity distribution; and an image forming optical system which irradiates a non-single-crystal film with the laser beam having the predetermined light intensity distribution, wherein the optical splitting/synthesizing means for splitting the pulse laser beam and synthesizing the split pulse laser beams includes at least three optical splitting/synthesizing means, one of the split pulse laser beams is sequentially split by downstream splitting/synthesizing means, the other one of the split pulse laser beams is returned to upstream splitting/synthesizing means, and synthesized with the other one of the split pulse laser beams.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a graph showing the relationship between the film thickness of a cap film on an amorphous silicon film and the grain length (μm) of needle crystal grains obtained by emitting a pulse laser beam;

FIGS. 10A and 10B are graphs showing the transient temperature distributions on the sections of samples when a cap film is formed and no cap film is formed;

FIG. 11 is a graph showing the relationship between the grain length of one-dimensional crystal grains and the energy density of a laser when waveform control is performed.

DETAILED DESCRIPTION OF THE INVENTION

Figure 1:
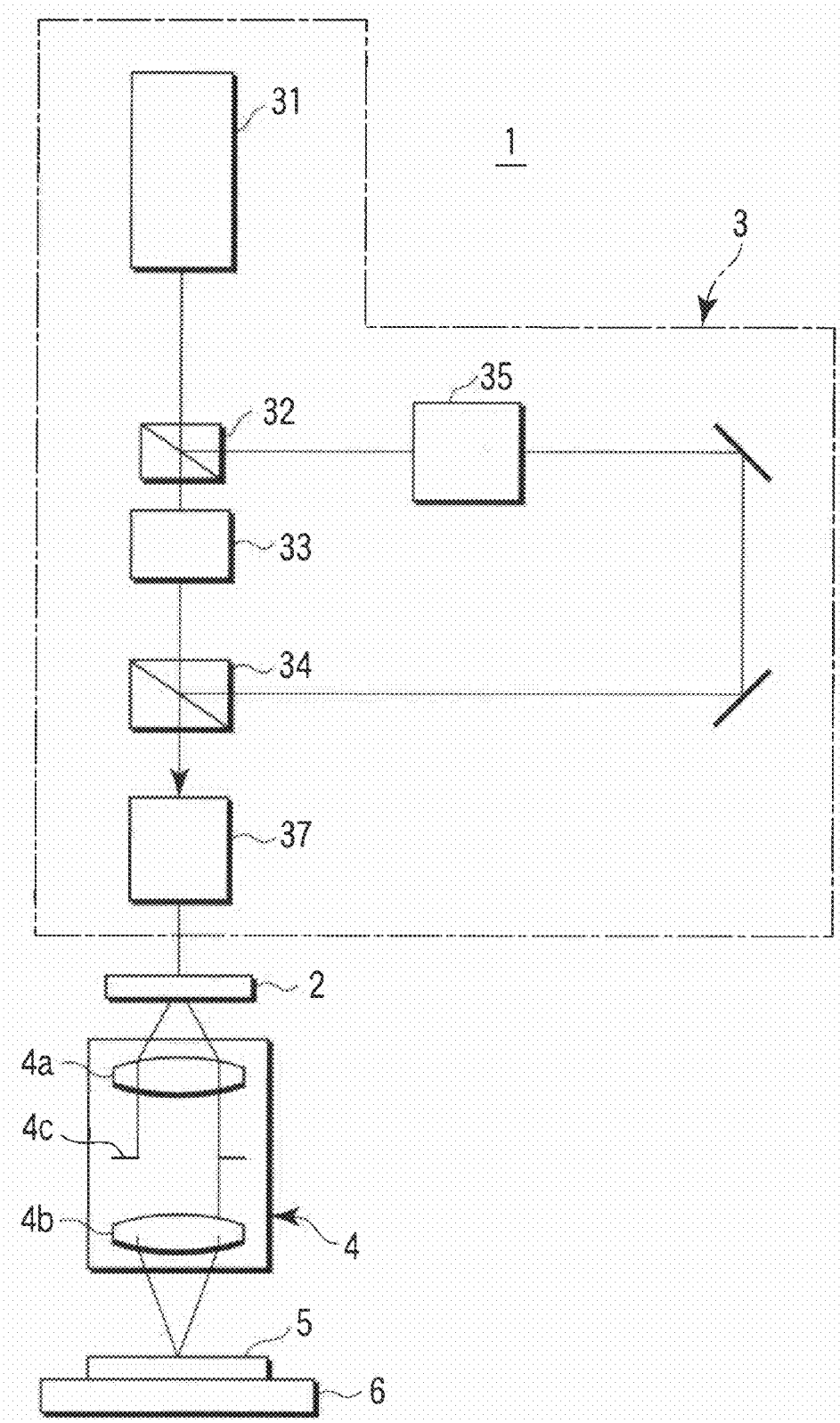
FIG. 1 is a block diagram showing an outline of an overall crystallizing apparatus using pulse laser emission, in order to explain the basic principle of the present invention.

Embodiments of the present invention will be explained below.

In a method of crystallizing a semiconductor film according to an embodiment of the present invention, a non-single-crystal semiconductor film is irradiated with a pulse laser beam, thereby to crystallize the irradiated portion. The pulse laser beam is oscillated from a laser oscillator, and split into a plurality of laser beams by at least three splitting/synthesizing optical elements such as partial transmitting mirrors and polarizing beam splitters. The split pulse laser beams propagate through optical paths different in optical path length, and are synthesized again. The synthesized laser beam is transmitted through an illuminating optical system, and modulated to have a desired light intensity distribution by a phase modulating element. After that, the modulated laser beam is emitted onto a non-single-crystal semiconductor film through a projecting optical system, thereby crystallizing the non-single-crystal semiconductor film.

As the pulse laser beam oscillated from the laser oscillator, it is possible to use a laser beam having a wavelength of 248 nm or more and a full-width at half maximum of 15 to 30 ns.

A cap layer can be formed on a non-single-crystal semiconductor film as needed. The cap layer is a light-transmitting or light-absorbing film formed on the surface away from a substrate supporting the semiconductor film. The light-transmitting cap layer is desirably a $SiO_2$ film having a thickness of 50 to 650 nm. A $SiO_2$ film can be formed more stably than the light-absorbing cap film such as the conventional $SiO_x$ film. This makes it possible to reduce the variations in quality of the crystallized semiconductor film.

The change in light intensity with time is as follows. It is important to sustain light so as to compensate for heat diffusing from the non-single-crystal semiconductor film to the substrate or to both the substrate and cap layer. To achieve this, this embodiment uses three or more splitting/synthesizing optical elements. This increases the pulse width of the pulse laser beam, and prolongs the pulse laser beam emission time. During the thus prolonged pulse laser beam emission time, the semiconductor film is held at a temperature close to the upper limit, and at the same time the temperatures of the substrate and cap layer rise. This moderates thermal diffusion after beam emission. Consequently, the cooling rate of the semiconductor film decreases, and the melting time extends. Since this increases the crystal growth distance, crystal grains having a large grain size can be obtained.

The light intensity distribution is an inverse peak distribution which is formed by the phase modulating element, and in which the light intensity continuously changes with respect to the position. It is possible to select a light intensity distribution for each of a one-dimensional crystal and two-dimensional crystal.

The basic principle of the present invention will be explained below by taking, as an example, a crystallizing apparatus including two polarizing beam splitters as light splitting/synthesizing optical elements. The present invention uses three or more light splitting/synthesizing optical elements, thereby obtaining a pulse width increasing effect much superior to that obtained when two light splitting/synthesizing optical elements are used. However, the basic principle is the same as that when two light splitting/synthesizing optical elements are used.

A crystallizing apparatus 1 shown in FIG. 1 is a projection type emitting apparatus including a phase modulating element 2, illuminating system 3, image forming optical system 4, and substrate stage 6. A substrate 5 to be processed is placed on the substrate stage 6 and irradiated with a pulse laser beam emitted in the order of illuminating system 3→phase modulating element 2→image forming optical system 4. On the surface to be irradiated of the substrate 5, a non-single-crystal semiconductor film (e.g., an amorphous silicon film) as a film to be crystallized and a cap film (e.g., a silicon oxide film) are formed.

The phase modulating element 2 is installed between the illuminating system 3 and image forming optical system 4. The phase modulating element 2 has a predetermined step and causes Fresnel diffraction of laser beams on this step, thereby modulating the phase of the incident bundle of rays. This gives the pulse laser beam a desired profile for optimally melting and crystallizing the film to be crystallized.

The illuminating system 3 has a XeCl excimer laser oscillator as a light source 31 for outputting energy light for melting the non-single-crystal semiconductor of the substrate 5. The light source 31 has unique characteristics that oscillate a pulse laser beam having a wavelength of 308 nm and a pulse width (half-width) of 30 ns. Note that the embodiment shown in FIG. 1 will be explained by taking a XeCl excimer laser oscillator as an example of the light source 31. However, it is also possible to use, e.g., a KrF excimer laser oscillator, an ArF excimer laser oscillator, or a YAG laser oscillator as the light source.

In addition, the illuminating system 3 includes, after the light source 31, a beam splitter 32 as a light splitting means, two attenuators 33 and 35 as laser intensity adjusting means, a beam splitter 34 as a light synthesizing means, and an illuminating optical system 37 arranged to oppose the phase modulating element 2. The beam splitter 32 splits the pulse laser beam emitted from the light source 31 into a P-polarized light component P1 and S-polarized light component P2. The P-polarized light component P1 propagates straight along the optical axis of the light source 31 and enters the beam splitter 34 as the light synthesizing means through the first attenuator 33. The S-polarized light component P2 propagates perpendicularly to the light source optical axis and enters the beam splitter 34 as the light synthesizing means through the second attenuator 35.

In this case, the P-polarized light component P1 propagating straight goes ahead as it is passed through a short laser optical path, and the S-polarized light component P2 in the perpendicular direction is passed through a long laser optical path (having an optical path length difference of, e.g., 10 m) so as to slightly lag behind the former. The light intensity distribution of each of the P-polarized light component P1 and S-polarized light component P2 is a sine-wave light intensity distribution having a peak value. The delay time of the S-polarized light component P2 with respect to the P-polarized light component P1 is set such that the S-polarized light component P2 is emitted in the position of the attenuating light intensity distribution light within the irradiation region of the P-polarized light component P1.

Figure 2:
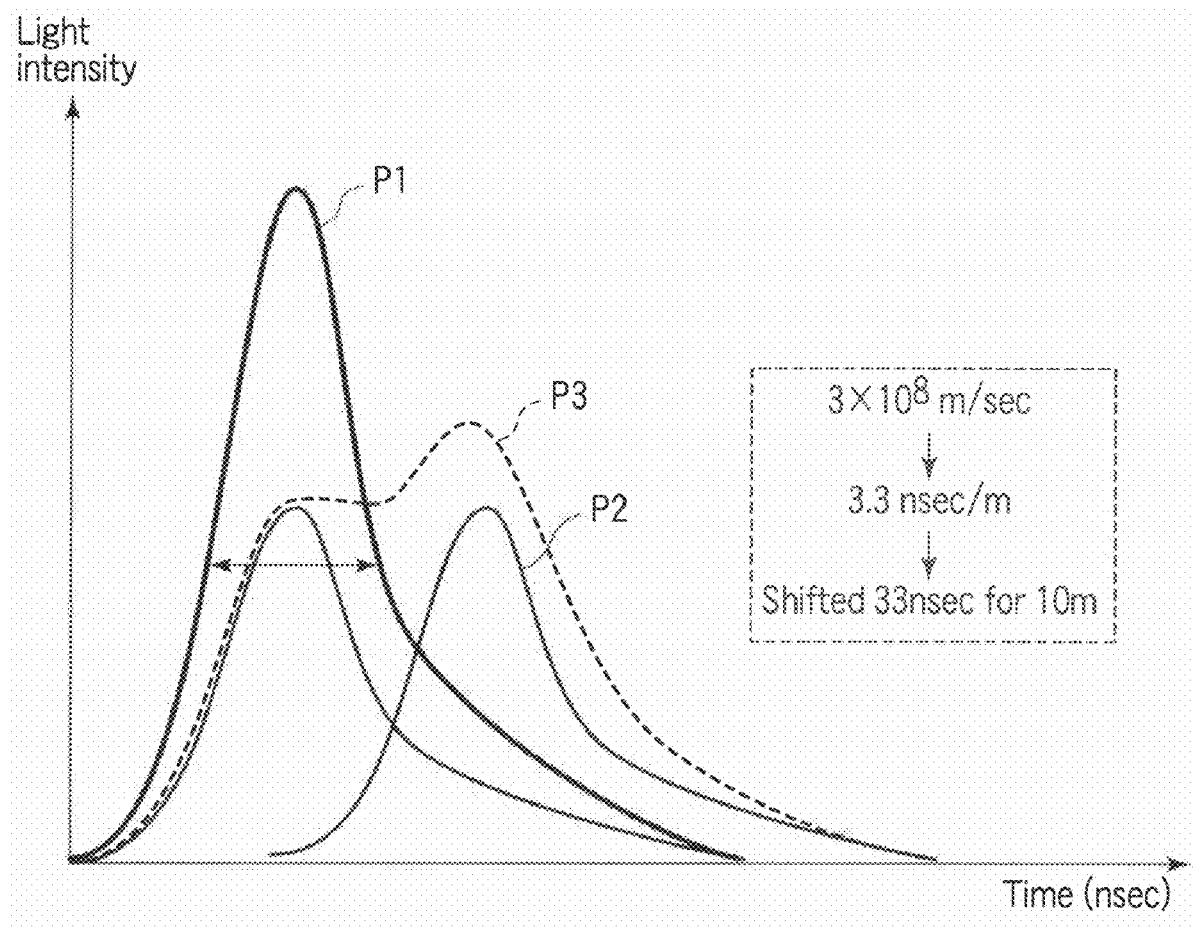
FIG. 2 is a graph showing the pulse waveform of split and synthesized pulse laser beams.

The laser intensity adjusting means 33 such as an attenuator sets the P- and S-polarized light components at a desired pulse intensity ratio P1/P2. In addition, the light synthesizing means such as the polarizing beam splitter 34 synthesizes the P-polarized light component P1 and S-polarized light component P2 into synthetic light P3 having a long pulse duration as shown in FIG. 2. The synthetic light P3 as one pulse laser beam passes through the phase modulating element and image forming optical system, and finally strikes the non-single-crystal semiconductor film on the substrate to be processed.

The surface having received the synthetic light P3 melts and crystallizes in a solidifying process within a cooling period after the pulse laser beam is interrupted. In this case, the pulse duration (half-width) of the synthetic light P3 is preferably 1.1 to 2.5 times the reference optical pulse duration (half-width). If the pulse duration of the synthetic light P3 is less than 1.1 times the reference optical pulse duration, the invention loses its effect of emitting a long pulse duration. If the pulse duration of the synthetic light P3 is more than 2.5 times the reference pulse duration, the unity of one pulse beam deteriorates. This makes uniform melting and crystallization impossible.

In other words, the surface having received the synthetic light P3 is obtained such that while the substrate 5 placed on the substrate stage 6 is moved at a predetermined velocity in, e.g., the X-axis direction, the substrate 5 is first irradiated with the P-polarized light component P1, and then irradiated with the S-polarized light component P2 after the above-mentioned delay time.

Consequently, as shown in FIG. 2, the surface having received the synthetic light P3 becomes wider than the surface having received the laser beam P emitted from the light source, and the crystallized region widens accordingly. The light intensity distribution shown in FIG. 2 is the light intensity distribution of the exit light from the light synthesizing means 34. As a consequence, a large crystallized region can be formed by one laser beam from the laser beam source 31.

For the descriptive simplicity, the embodiment shown in FIG. 1 uses the two beam splitters 32 and 34 as the optical splitting/synthesizing means for the pulse laser beam. However, the present invention must use three or more, preferably, three to twelve optical splitting/synthesizing means for the pulse laser beam. A pulse laser beam having a long pulse duration can be obtained by thus using three or more optical splitting/synthesizing means. Note that it is unfavorable to use thirteen or more optical splitting/synthesizing means because the apparatus becomes complicated and large and the cost increases.

When the cost, performance, and stability of the apparatus are totally taken into account, the light splitting/synthesizing means can be selected from a polarizing beam splitter, a partially transmitting mirror, and a combination of the above. When using a polarizing beam splitter, the light splitting angle can be set at an arbitrary value within the range of 5° to 175°. However, the light splitting angle is preferably 90°±1° because this angle simplifies the structure of the apparatus, and facilitates layout design for peripheral devices.

When using three or more, preferably, three to twelve partially transmitting mirrors as the optical splitting/synthesizing means, these partially transmitting mirrors can be arranged such that a reflectance R1 of the first partially transmitting mirror closest to the laser oscillator on the optical path is 0.3 to 0.6, the reflectances of the second to nth partially transmitting mirrors are $R2<(R1/3)$ and $R2<R3<R4< \ldots <Rn$, a totally reflecting mirror is set behind the nth partially transmitting mirror, and the optical path length to an adjacent mirror is 2,250 mm to 5,000 mm.

If R1 is less than 0.3, the intensity of a laser beam reflected by the first partially reflecting plate may be low and may not reach the energy required to melt the non-single-crystal semiconductor film, resulting in a low efficiency. If R1 exceeds 0.6, the intensity of a laser beam reaching the second and subsequent mirrors may be low, and this may decrease the effect of compensating for heat diffusing from the non-single-crystal semiconductor film to the substrate or cap layer. When the reflectances of the second to nth partially transmitting mirrors are $R2<(R1/3)$ and $R2<R3<R4< \ldots <Rn$, it is possible to effectively compensate for heat diffusing from the non-single-crystal semiconductor film to the substrate or cap layer.

When using seven partially transmitting mirrors, the reflectance Rn of the nth partially transmitting mirror from the laser oscillator on the optical path is such that $R1=0.56\pm0.03$, $R2=0.07\pm0.03$, $R3=0.14\pm0.03$, $R4=0.17\pm0.03$, $R5=0.25\pm0.03$, $R6=0.35\pm0.03$, and $R7=0.45\pm0.03$, a totally reflecting mirror is set next to the partially transmitting mirror having the reflectance R7, and the seven partially transmitting mirrors and one totally reflecting mirror are arranged such that the optical path length to an adjacent mirror is 4,500 mm. Light transmitted through the first partially transmitting mirror enters the second partially transmitting mirror, light reflected by the first partially transmitting mirror is guided to the illuminating optical system, light transmitted through the second partially transmitting mirror enters the third partially transmitting mirror, light reflected by the second partially transmitting mirror is guided to the illuminating optical system through the first partially transmitting mirror, and so on. Light transmitted through the nth partially transmitting mirror enters the (n+1)th partially transmitting mirror, and light reflected by the nth partially transmitting mirror is guided to the illuminating optical system through the (n−1)th, (n−2)th, . . . , first partially transmitting mirrors. However, light transmitted through the seventh partially transmitting mirror is reflected by the totally reflecting mirror, and guided to the illuminating optical system through the seventh, sixth, . . . , first partially transmitting mirrors.

The reflectance Rn of the nth partially transmitting mirror is also that R1=0.40±0.03, R2=0.07±0.03, R3=0.085±0.03, R4=0.095±0.03, R5=0.125±0.03, R6=0.017±0.03, and R7=0.25±0.03.

The delay time when the split lights are synthesized, is preferably approximately full width half maximum. The reason is that, when the delay time becomes short, the splitting/synthesizing effects are reduced, and when the delay time becomes long, the laser pulse is not a single laser pulse of an extended pulse width, but is close to a plurality of laser pulses.

As described above, it is possible to employ a laser beam having a full width half maximum of 15 ns to 30 ns. The distances which the laser beam propagates for 15 ns and 30 ns are 4500 mm and 9000 mm, respectively. When the optical path length between the adjacent mirrors is set to 2250 mm to 4500 mm, it is possible to set a round trip time between the adjacent mirrors to 15 ns to 30 ns. When the optical path length between the adjacent mirrors is set to 5000 mm, it is possible to set a round trip time between the adjacent mirrors to 33 ns.

Figure 3:
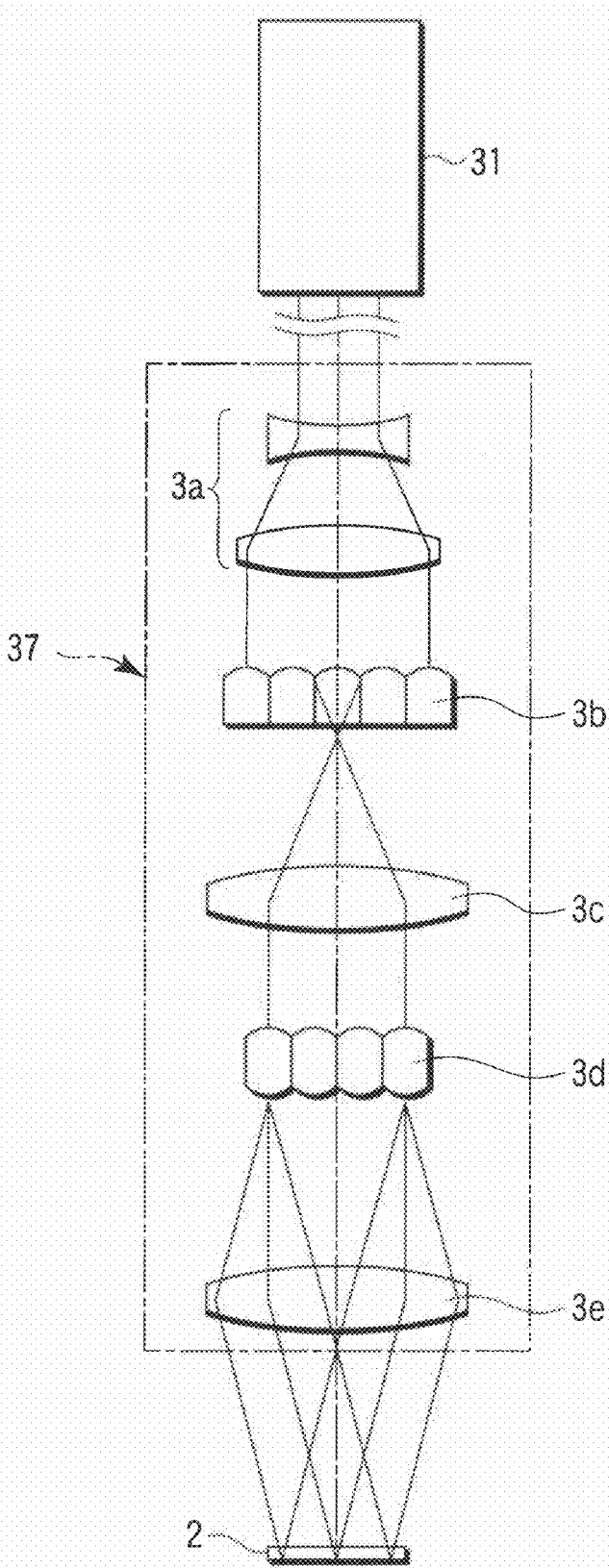
FIG. 3 is a block diagram showing an optical system of the apparatus shown in FIG. 1.

Details of the illuminating optical system 37 will now be explained with reference to FIG. 3.

The synthetic light R3 having entered the illuminating optical system 37 is expanded by a beam expander 3a, and enters a first fly-eye lens 3b. In this manner, small light sources are formed on the rear focal plane of the first fly-eye lens 3b. A bundle of rays from these light sources superpositionally illuminate the incident surface of a second fly-eye lens 3d via a first condenser optical system 3c. Consequently, small light sources larger in number than those formed on the rear focal plane of the first fly-eye lens 3b are formed on the rear focal plane of the second fly-eye lens 3d.

A bundle of rays from the small light sources formed on the rear focal plane of the second fly-eye lens 3d superpositionally illuminate the phase modulating element 2 via a second condenser optical system 3e. The first fly-eye lens 3b and first condenser optical system 3c form a first homogenizer. The first homogenizer homogenizes the incident angle, on the phase modulating element 2, of the laser beam supplied from the light source 31.

The second fly-eye lens 3d and second condenser optical system 3e form a second homogenizer. The second homogenizer homogenizes the light intensity, in each position on the surface of the phase modulating element 2, of the laser beam having the incident angle homogenized by the first homogenizer. Thus, the illuminating system 3 illuminates the phase modulating element 2 with the laser beam having an almost uniform light intensity distribution.

The laser beam having a phase modulated by the phase modulating element 2 has an inverse-peak-pattern light intensity distribution. The inverse-peak-pattern light intensity distribution is a distribution in which the light intensity continuously changes from a minimum light intensity value to a maximum light intensity value within the beam diameter of one laser beam. The minimum light intensity value is set at a temperature equal to or lower than the melting point of the non-single-crystal semiconductor film on the substrate to be processed. The laser beam strikes the substrate 5 via the image forming optical system 4.

The image forming optical system 4 arranges the pattern surface of the phase modulating element 2 and the substrate 5 (more strictly, the upper surface of the non-single-crystal semiconductor film) such that they are optically conjugate. In other words, the substrate 5 is set in a plane (the image plane of the image forming optical system 4) that is optically conjugate with the pattern surface of the phase modulating element 2. The image forming optical system 4 has an aperture stop 4c between a front positive lens group 4a and rear positive lens group 4b. The aperture stop 4c includes a plurality of aperture stops different in size of an aperture (light-transmitting portion) or the like. These aperture stops 4c may also be interchangeably formed with respect to the optical path. Alternatively, an iris stop capable of continuously changing the aperture size may also be used instead of the aperture stop 4c. In either case, the size of the aperture of the aperture stop 4c (i.e., an image-side numerical aperture NA of the image forming optical system 4) is set to generate a necessary light intensity distribution on the semiconductor layer of the substrate 5 as will be described later. The image forming optical system 4 can be any of a refracting optical system, reflecting optical system, and refracting and reflecting optical system.

Finally, an image of the synthetic light P3 is formed on the thin amorphous film of the substrate 5. As a consequence, the thin amorphous film melts and crystallizes during a solidifying process. The substrate 5 is obtained by, e.g., sequentially forming an underlying film, amorphous silicon film (semiconductor layer), and cap film prepared by chemical vapor deposition (CVD) on a plate glass substrate for a liquid crystal display. The underlying insulating film is made of an insulator, e.g., $SiO_2$. This underlying insulating film prevents foreign matter such as Na in the glass substrate from mixing in the amorphous silicon film by a direct contact between the amorphous silicon film and glass substrate, and also prevents the melting temperature of the amorphous silicon film from being directly conducted to the glass substrate. The amorphous silicon film is a semiconductor film to be crystallized, and is a non-single-crystal film. Examples are an amorphous semiconductor film and polycrystalline semiconductor.

The non-single-crystal film is not limited to the above semiconductor film, and may also be a film made of a non-single-crystal material such as a non-single-crystal metal. An insulating film, e.g., a $SiO_2$ film is preferably formed as the cap film on the amorphous silicon film. The cap film is heated by a part of the light beam having entered the amorphous silicon film, and stores the heat. If there is no cap film, a high-temperature portion on the irradiated surface of the amorphous silicon film relatively rapidly cools when the light beam is interrupted. The heat storage effect of the cap film relaxes this cooling slope, and promotes lateral crystal growth of large grains. The substrate 5 is positioned and held in a predetermined position on the substrate stage 6 by a vacuum chuck or electrostatic chuck.

Outlines of a crystallizing method and crystallizing apparatus according to an embodiment of the present invention will be explained below with reference to FIG. 4.

Figure 4:
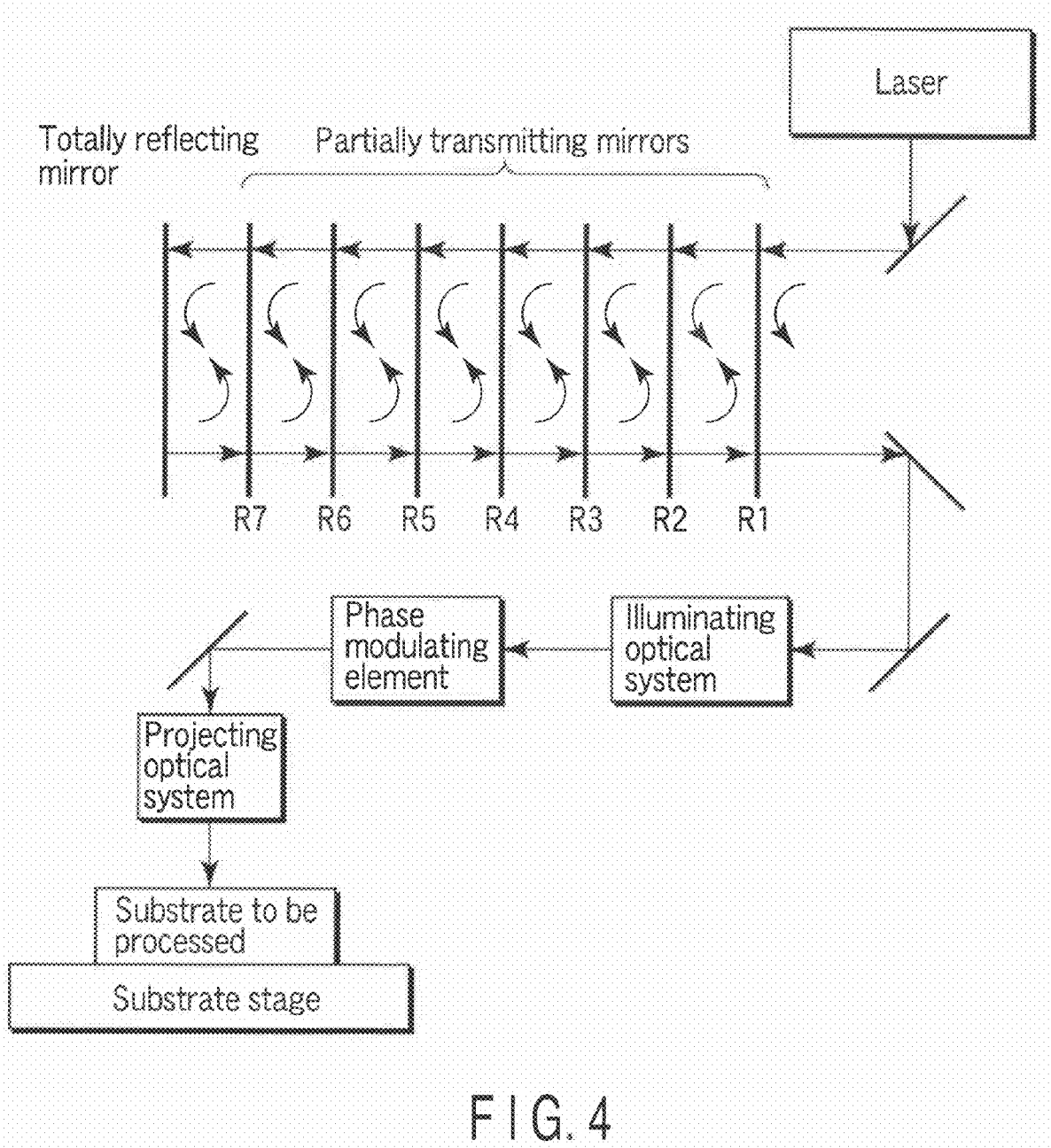
FIG. 4 is a block diagram showing a crystallizing apparatus according to an embodiment of the present invention.

This crystallizing apparatus shown in FIG. 4 is comprised of a laser beam source, seven partially transmitting mirrors R1 to R7, a totally reflecting mirror, an illuminating optical system, a phase modulating element, a projecting optical system, and a substrate stage. A substrate to be processed having a non-single-crystal semiconductor film is placed on the substrate stage.

A pulse laser beam from the laser beam source irradiates the substrate to be processed through the partially transmitting mirrors, totally reflecting mirror, illuminating optical system, phase modulating element, and projecting optical system.

As the pulse laser beam oscillated by a laser oscillator, a XeCl excimer laser having a wavelength of 308 nm and a full width at half maximum of about 25 ns was used. The laser beam oscillated from the laser oscillator is input to an optical device including the seven partially transmitting mirrors, the totally reflecting mirror, and totally reflecting concave mirrors for suitably setting the distances between these optical elements and the optical paths of the elements. The reflectances Rn of the partially transmitting mirrors were set such that R1=0.40, R2=0.07, R3=0.085, R4=0.095, R5=0.125, R6=0.17, and R7=0.25 from the one closest to the laser on the optical path. The totally reflecting mirror was set behind the partially transmitting mirror having the reflectance R7. The optical path length to an adjacent mirror was 4,500 mm.

Note that in this embodiment, the partially transmitting mirrors are arranged between the totally reflecting concave mirrors. However, flat mirrors may also be used instead of the concave mirrors, or the partially transmitting mirrors may also be arranged straight without using any of these mirrors as shown in FIG. 4.

In the crystallizing apparatus shown in FIG. 4 as described above, the seven partially transmitting mirrors transmit and reflect the pulse laser beam as follows. That is, light transmitted through the first partially transmitting mirror R1 enters the second partially transmitting mirror R2, light reflected by the first partially transmitting mirror R1 is guided to the illuminating optical system, light transmitted through the second partially transmitting mirror R2 enters the third partially transmitting mirror R3, light reflected by the second partially transmitting mirror R2 is guided to the illuminating optical system through the first partially transmitting mirror R1, and so on. Light transmitted through the nth partially transmitting mirror enters the (n+1)th partially transmitting mirror, and light reflected by the nth partially transmitting mirror is guided to the illuminating optical system through the (n−1)th partially transmitting mirror, (n−2)th partially transmitting mirror, . . . , first partially transmitting mirror R1.

Note that light transmitted through the seventh partially transmitting mirror R7 is reflected by the totally reflecting mirror, and guided to the illuminating optical system through the seventh, sixth, . . . , first partially transmitting mirrors.

This repetition of transmission and reflection elongates the pulse duration, and prolongs the time of irradiation to the substrate to be processed. Consequently, at the time at which the temperature of the silicon film reaches a maximum, heat larger in amount than that when the pulse duration is not elongated diffuses from the silicon film to the cap film and the underlying $SiO_2$ layer, thereby raising their temperatures. This decreases the cooling rate of the silicon film, prolongs the melting time of the silicon film, and increases the distance of crystal growth. As a consequence, crystal grains having a large grain size can be obtained.

By contrast, when no such pulse waveform control as above is performed, the amount of heat having diffused to the cap film and the underlying $SiO_2$ layer is small at the time at which the temperature of the silicon film reaches a maximum. Therefore, the cooling rate of the silicon film is higher than that when the waveform is controlled. This shortens the melting time of the silicon film and crystal growth distance.

Figure 5A:
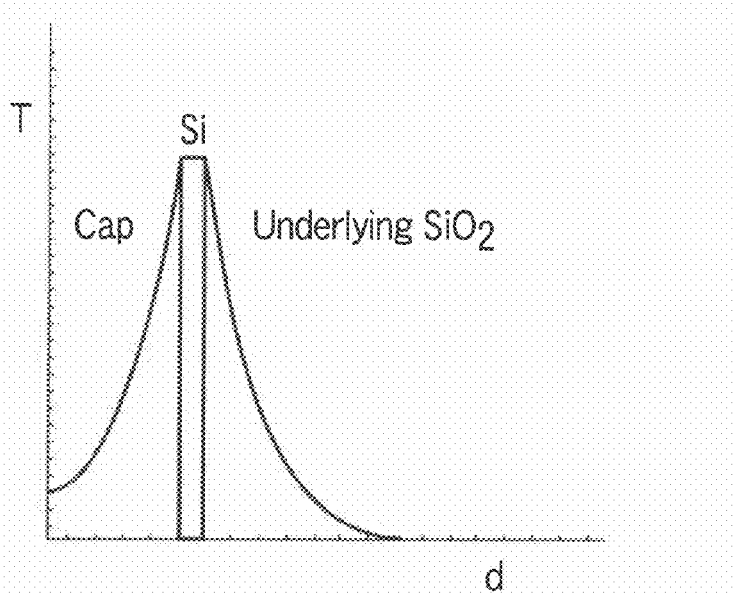
FIGS. 5A and 5B are graphs each showing the temperature distribution on the section of a sample immediately after laser emission.
Figure 5B:
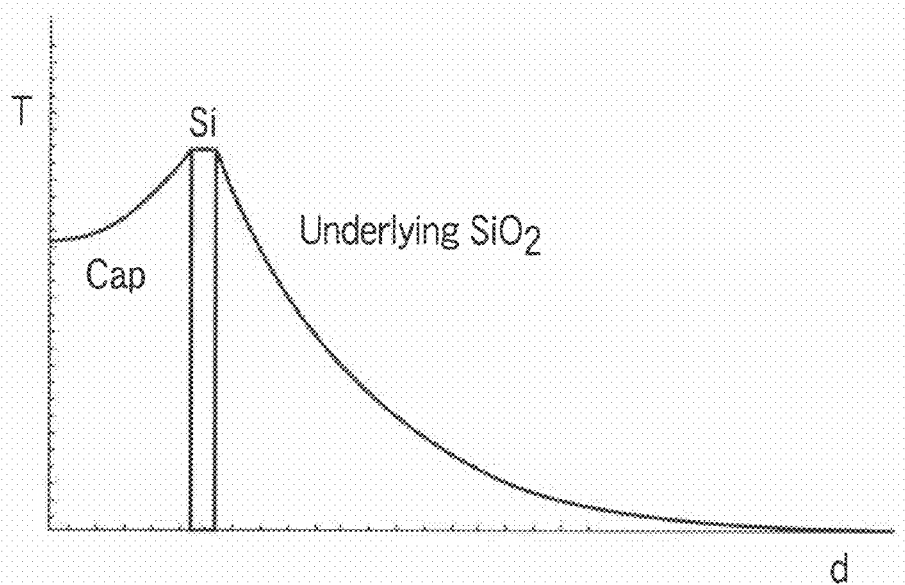

FIGS. 5A and 5B illustrate the temperature distributions on the sections of samples immediately after laser beam emission, in order to indicate the above phenomenon. FIG. 5A shows the case where no pulse waveform control is performed. FIG. 5B shows the case where pulse waveform control is performed.

The present invention will be explained in more detail below by way of its examples.

EXAMPLE 1

In this example, an amorphous silicon film having a cap film formed on its upper surface was crystallized by using a pulse laser beam.

A sample obtained by reducing the hydrogen content in a 50-nm thick amorphous silicon film formed on a quartz substrate by PECVD by heating the film to 600° C. was used. A crystallizing apparatus as shown in FIG. 4 was used to irradiate the obtained sample with a pulse laser beam given a desired light intensity distribution by a phase modulating element while pulse waveform control was performed by seven partially transmitting mirrors, thereby crystallizing the amorphous silicon film.

FIG. 6 shows the grain length (μm) of needle crystal grains obtained by irradiating a sample in which a $SiO_2$ film 50 to 550 nm thick was formed as a cap film on a 50-nm thick amorphous silicon film, with a pulse laser beam given a V-shaped light intensity distribution by the phase modulating element. FIG. 6 also shows the result of a sample having no cap layer, to be explained later in Example 2.

FIG. 6 reveals that a maximum grain length was 7.5 μm in the prior art in which no pulse waveform control was performed by partially transmitting mirrors, whereas crystal grains having a maximum grain size of 25 μm grew in this example in which pulse waveform control was performed using the seven partially transmitting mirrors.

Figure 7A:
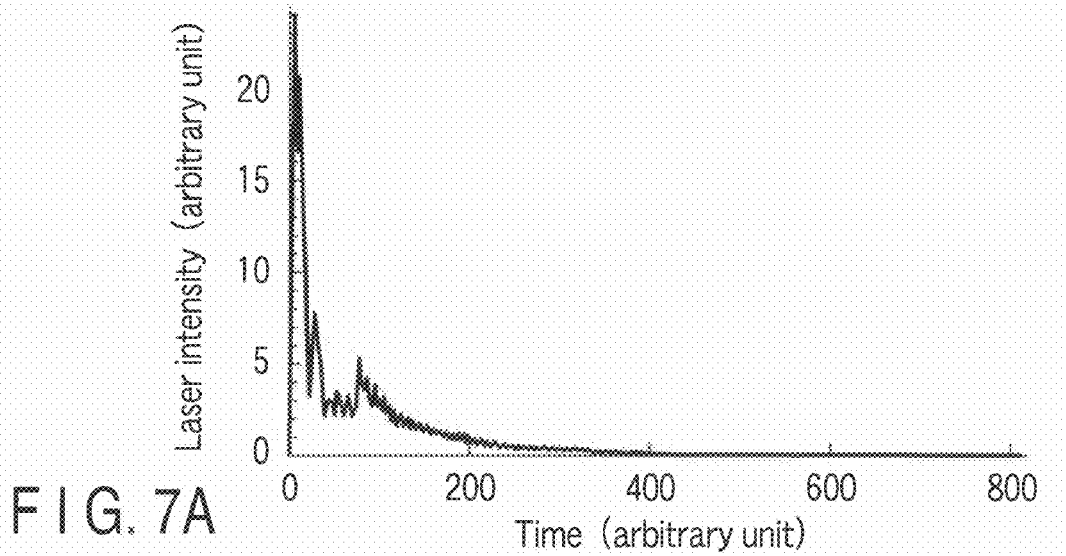
FIGS. 7A and 7B are graphs showing the changes in laser intensity and silicon film temperature with time in Example 1.
Figure 7B:
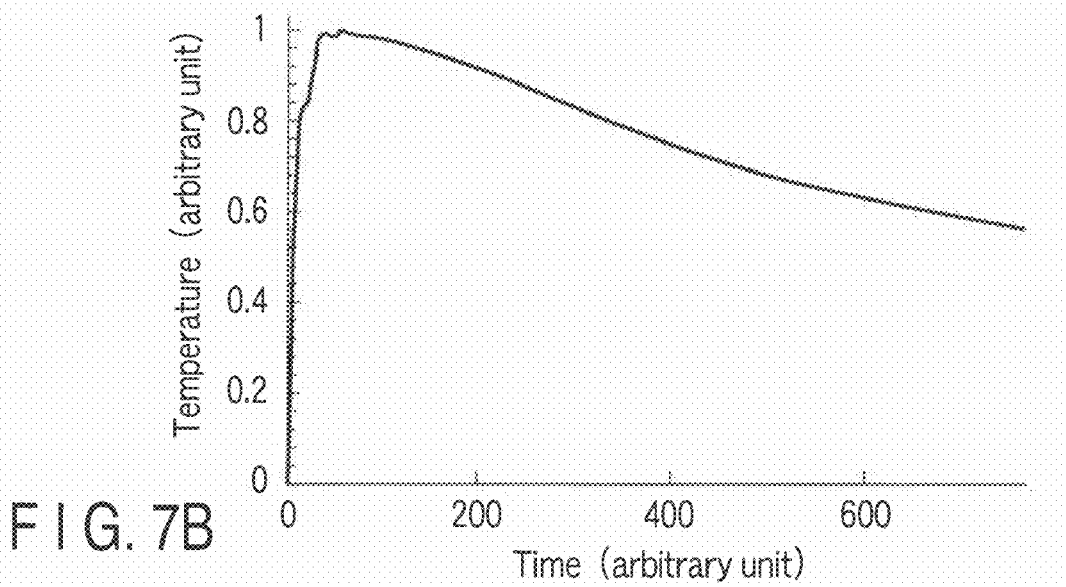

This phenomenon will be explained below by taking the case where a 550-nm cap layer is formed on an amorphous silicon film as an example. FIG. 7A shows the change in laser intensity with time, i.e., the pulse waveform. FIG. 7B shows the transient temperature change of the silicon film. These values are calculated values, and the scales are arbitrary scales. The pulse waveform can be measured in a position immediately before the position where the laser beam enters the illuminating optical system in FIG. 4 or in a position downstream of the illuminating optical system, by sensing scattered light by a sensor such as a photodiode, and feeding the output to a high-speed oscilloscope.

The temperature of the silicon film shown in FIG. 7B indicates the temperature of a place where the light intensity is highest in the V-shaped light intensity distribution obtained by the phase modulating element. When the temperature reaches a maximum, crystal nuclei form in a place where the light intensity is lowest, i.e., the light intensity is about 50%, and start lateral crystal growth. Note that the position where the crystal nuclei form corresponds to the threshold value at which the silicon film completely melts.

FIGS. 7A and 7B demonstrate that in this example, the intensity of the pulse laser beam is maintained for a predetermined time even after the start of lateral growth. Although heat diffuses from the silicon film to the substrate and cap layer during the process, the transmittances of the partially transmitting mirrors are set such that the pulse laser beam is emitted to compensate for the heat.

Since the pulse laser beam emission time is long as described above, the cooling rate of the silicon film after the silicon film temperature reaches a maximum is lower than that of prior art in which no pulse waveform control is performed. This makes the silicon film melting time longer than that of the prior art, thereby increasing the crystal growth distance.

Crystal growth progresses while the silicon film temperature lowers. However, when the temperature of a place where the light intensity is highest in the V-shaped light intensity distribution of the pulse laser beam lowers to the threshold value at which the silicon film completely melts, random nuclei form in this place, and lateral crystal growth stops.

From the foregoing, the crystal growth time can be calculated by using FIG. 7B. Assuming that the crystal growth rate is 13 m/s, based on a reference (Y. Takami et al., 210th ECS (2006) E-15(TFT-8)), the crystal growth distance is about 22 μm, which matches well with the result shown in FIG. 6.

Figure 8:
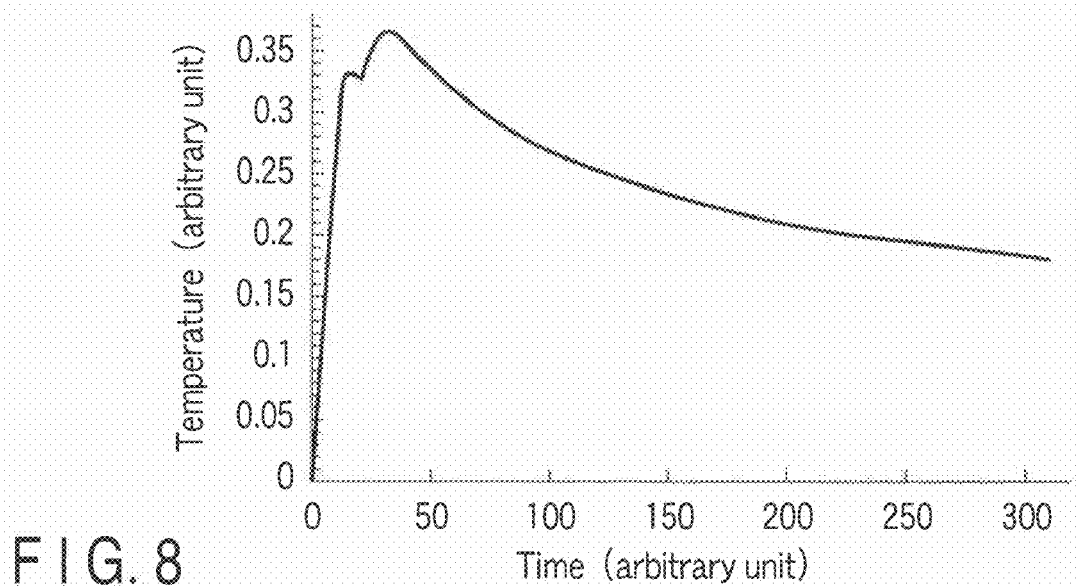
FIG. 8 is a graph showing the change in silicon film temperature caused by pulse laser beam emission in Example 1.

On the other hand, FIG. 8 shows the transient temperature change of a silicon film in the prior art in which no pulse waveform control is performed. When the same calculation as in this example is performed, the crystal growth distance is about 7.5 μm, which almost matches the result shown in FIG. 6. Note that the abscissa in FIG. 8 corresponds to that in FIG. 7B although the unit is an arbitrary unit.

As described previously, FIG. 6 shows the crystal grain length when the V-shaped light intensity distribution was used. The preset inventors conducted the same experiment on a stepwise light intensity distribution formed by a metal mask, instead of the V-shaped light intensity distribution formed by the phase modulating element, and checked the crystal grain lengths when the cap layer was formed and no cap layer was formed. Consequently, when a sample having the cap layer was irradiated with pulses having the stepwise light intensity distribution, the crystal grain length was 2.8 μm when no pulse waveform control was performed, and 9 μm when pulse waveform control was performed.

Figure 9A:
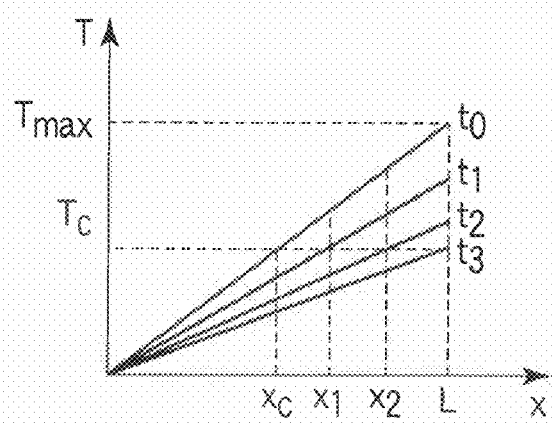
FIGS. 9A to 9D are graphs showing light intensity distributions and transient temperature changes when a phase modulating element and a metal mask are used.
Figure 9B:
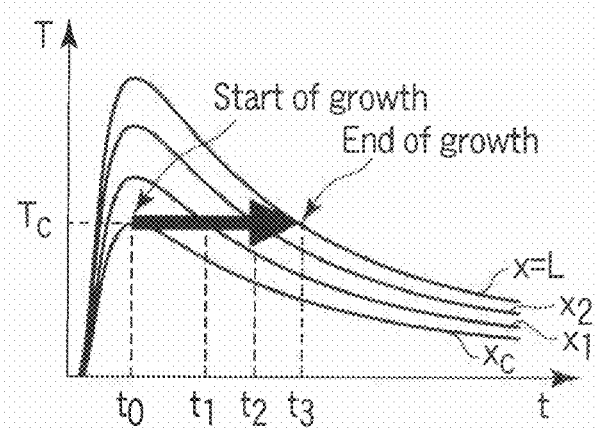
Figure 9C:
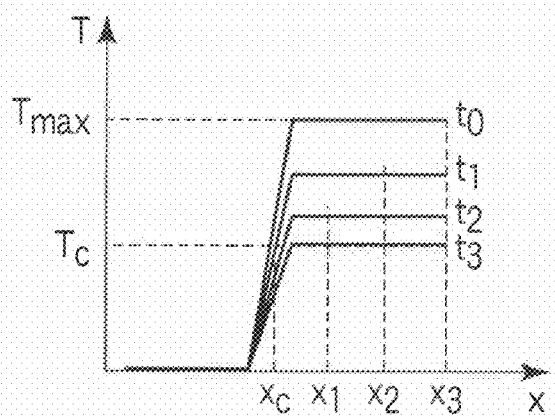
Figure 9D:
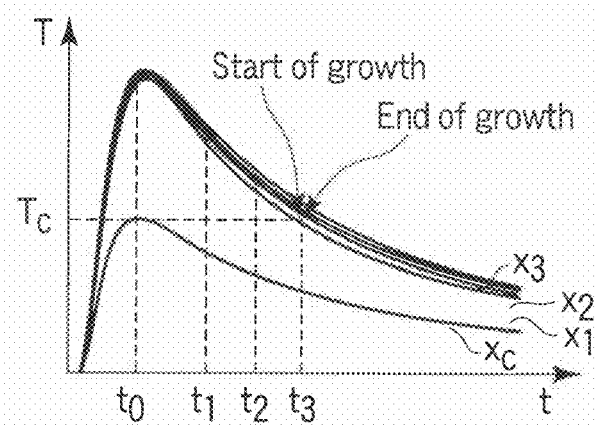

As described above, when the phase modulating element was used, it was possible to obtain crystal grains having a length twice or more that when the stepwise light intensity distribution was formed using the metal mask. The reason for this will be explained below with reference to FIGS. 9A to 9D. FIGS. 9A and 9B respectively show the light intensity distribution and transient temperature change when the phase modulating element was used. FIGS. 9C and 9D respectively show the light intensity distribution and transient temperature change when the metal mask was used.

When the phase modulating element was used, the temperature of $x=x_C$ was a critical temperature $T_C$ of crystal nuclei generation and the temperature of $x=L$ was a maximum temperature $T_{max}$ of the silicon film at time $t_0$. The light intensity decreased as the time progressed from $t_0$ to $t_1$, $t_2$, and $t_3$. The drawing of the transient temperature change shows the change in temperature with time when $x=x_C$, $x_1$, and $x_2$. When the phase modulating element was used, the crystal started lateral growth from the crystal nuclei generated in the position $x_C$ at time $t_0$, and crystal growth reached the position $x_1$ at time $t_1$. The crystal grew as the time progressed, and crystal growth continued to time $t_3$ at which the temperature in the position L decreased to $T_C$. That is, the crystal grains grew from time $t_0$ to time $t_3$.

On the other hand, when the metal mask was used, the temperature in the position $x_C$ was $T_C$ and the temperatures in the positions $x_1$, $x_2$, and $x_3$ were $T_{max}$ at time $t_0$. Crystal nuclei generated in the position $x_C$ at time $t_0$ tried to grow in a direction along which the temperature rose (to the right in the drawing), but could not solidify because the temperature in $x_1$ was still higher than $T_C$. That is, lateral crystal growth was impossible. The temperature in the position $x_1$ decreased to $T_C$ at time $t_3$ at which the crystal finally grew to the position $x_1$. At time $t_3$, however, the temperatures in the positions $x_2$ and $x_3$ had fallen to $T_C$. In the positions $x_2$ and $x_3$, therefore, random nuclei were generated to form a large number of fine crystal grains, and lateral growth stopped.

As described above, when the phase modulating element is used, the distance of lateral growth can be made larger than that when the metal mask is used.

EXAMPLE 2

In this example, an amorphous silicon film was crystallized following the same procedures as in Example 1 except that no cap film was formed on the amorphous silicon film.

Consequently, as shown in FIG. 6, when the film was crystallized by a pulse laser of the prior art in which no waveform control was performed, only crystal grains having a grain length of 2.5 μm were obtained. On the other hand, the grain length of crystal grains was about 11 μm in this example.

When the crystal growth distances were calculated for this example and the prior art in the same manner as in Example 1, the crystal growth distance of the prior art was about 2 μm, and that of this example was 13 μm. These values matched the results shown in FIG. 6 well.

In this example as described above, crystal grains having a grain length of 10 μm or more can be obtained by crystallization using an excimer laser even when no cap layer is formed. When fabricating a TFT by a conventional method, a step of etching away a cap layer is necessary after crystallization. However, this example can form crystal grains having a large grain size without any cap layer. This obviates the need for a step of forming a cap layer, and a step of removing a cap layer after crystallization. This is very advantageous from the viewpoints of the fabrication cost and yield in the mass-production of TFTs and products such as LCDs and OLEDs using the TFTs.

As described in Examples 1 and 2, the crystal grain length changes in accordance with the presence/absence of the cap film. This can be understood from FIGS. 10A and 10B. That is, when no cap film is formed (FIG. 10A), heat absorbed by the silicon film diffuses to only the underlying $SiO_2$ side (substrate side). On the other hand, when the cap film is formed (FIG. 10B), heat absorbed by the silicon film diffuses to both the cap film and the underlying $SiO_2$. The heat having diffused to the cap film diffuses to the silicon film again with the elapse of time. Therefore, the melting time of the silicon film extends and the crystal grain length increases when the cap film is formed.

FIG. 11 shows the dependence of the crystal grain length on the energy density for each of the cases where the cap film is formed and no cap film is formed described in Examples 1 and 2. When obtaining crystal grains of 20 μm or more with a 550-nm thick cap film, the energy density margin is 150 mJ/cm$^2$ or more. Similarly, the energy density margin is 150 mJ/cm$^2$ or more when obtaining crystal grains of 10 μm or more without any cap film. Accordingly, there is probably a sufficient margin for the energy variation for each laser pulse.

SEM image analysis and SEM-EBSP analysis were performed on the crystal grains in the cases where the cap film was formed and no cap film was formed, as described in Examples 1 and 2. Consequently, the grain width of the one-dimensional crystal grains (needle crystal grains) with pulse waveform control was larger than that without pulse waveform control.

EXAMPLE 3

This example is directed to crystal grains having a two-dimensional spread obtained by controlling the generation of crystal nuclei of crystal grains that grow to have a large grain size.

By using a sample in which 550-nm thick $SiO_2$ was formed as a cap layer on the upper surface of a 50-nm thick amorphous silicon film, the amorphous silicon film was crystallized following the same procedures as in Example 1 except that a phase modulating element designed to two-dimensionally grow crystal grains was used.

Figure 12:
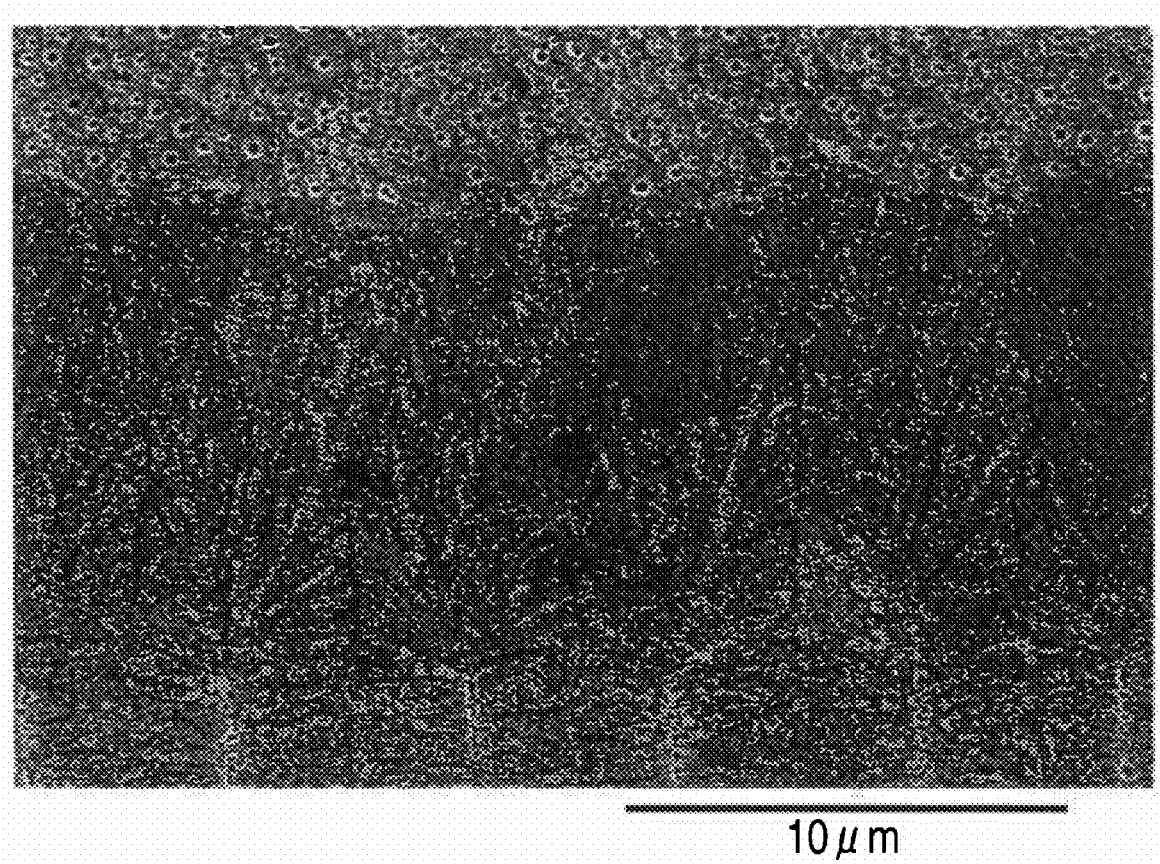
FIG. 12 is an SEM image of two-dimensional crystal grains grown from a single growth nucleus in Example 3.

"A two-dimensionally grown crystal grain" is a crystal grain that two-dimensionally grows from a unitary crystal nucleus and can be regarded as a pseudo single crystal. When this phase modulating element is used in the prior art in which no waveform control is performed, crystal grains about, e.g., 5 μm square are formed. By contrast, when a pulse laser having undergone waveform control of this example is emitted, it is possible to form crystal grains of about 5 μm×20 μm or about 20 μm×20 μm. FIG. 12 shows the SEM image of crystal grains of 5 μm×10 μm as an example.

Also, the grain size of two-dimensional pseudo single-crystal grains can be increased even in a sample structure having no cap layer, as in the case where the crystal grain size of needle crystal grains increases.

As described above, this example has the effect of increasing the grain size of not only the one-dimensional needle crystal as described in Examples 1 and 2, but also two-dimensional pseudo single-crystal silicon. It is possible to freely select a one-dimensional crystal or two-dimensional crystal and its crystal size by design of the phase modulating element.

What is claimed is:

1. A method of crystallizing a semiconductor film comprising:
    splitting a pulse laser beam oscillated from a laser oscillator, and synthesizing the split pulse laser beams after the split pulse laser beams have propagated through optical paths different in optical path length;
    modulating the synthesized pulse laser beam into a pulse laser beam by a phase modulating element; and
    irradiating a non-single-crystal film formed on a substrate with the synthesized laser beam to crystallize the non-single-crystal film,
    wherein splitting the pulse laser beam and synthesizing the split pulse laser beams are performed using at least three optical splitting/synthesizing means arranged in order, and include
    sequentially splitting one pulse laser beam split by one optical splitting/synthesizing means by succeeding splitting/synthesizing means, and
    synthesizing the other pulse laser beam split by one optical splitting/synthesizing means with the other pulse laser beam split by preceding splitting/synthesizing means.

2. The method according to claim 1, wherein a light-transmitting or light-absorbing cap layer is formed on a surface of the non-single-crystal semiconductor film away from the substrate.

3. The method according to claim 2, wherein the light-transmitting cap layer is made of $SiO_2$ and has a thickness of 50 to 650 nm.

4. The method according to claim 1, wherein the optical splitting/synthesizing means includes three to twelve optical splitting/synthesizing means.

5. The method according to claim 1, wherein each of the optical splitting/synthesizing means is one of a partially transmitting mirror and a polarizing beam splitter.

6. The method according to claim 1, wherein the laser beam oscillated from the laser oscillator has a wavelength of not less than 248 nm, a full width at half maximum of 15 to 30 ns, and a light intensity of the laser beam obtained by splitting the laser beam and synthesizing the split laser beams and emitted onto the non-single-crystal semiconductor film changes with time to compensate for diffusion of heat from the non-single-crystal semiconductor film to one of the substrate and the cap layer after the non-single-crystal semiconductor film is melted.

7. The method according to claim 1, wherein the optical splitting/synthesizing means are partially transmitting mirrors, a reflectance R1 of a first partially transmitting mirror closest to the laser oscillator on the optical path is 0.3 to 0.6, reflectances of second to nth partially transmitting mirrors are R2<(R1/3) and R2<R3<R4< . . . <Rn, a totally reflecting mirror is set behind the nth partially transmitting mirror, and an optical path length to an adjacent mirror is 2,250 mm to 5,000 mm.

8. The method according to claim 5, wherein the partially transmitting mirrors include seven partially transmitting mirrors, a reflectance Rn of an nth partially transmitting mirror from the laser oscillator on the optical path is such that R1=0.56±0.03, R2=0.07±0.03, R3=0.14±0.03, R4=0.17±0.03, R5=0.25±0.03, R6=0.35±0.03, and R7=0.45±0.03, a totally reflecting mirror is set next to a partially transmitting mirror having the reflectance R7, the seven partially transmitting mirrors and one totally reflecting mirror are arranged such that an optical path length to an adjacent mirror is 4,500 mm, light transmitted through a first partially transmitting mirror enters a second partially transmitting mirror, light reflected by the first partially transmitting mirror is guided to an illuminating optical system, light transmitted through the second partially transmitting mirror enters a third partially transmitting mirror, light reflected by the second partially transmitting mirror is guided to the illuminating optical system through the first partially transmitting mirror, . . . , light transmitted through the nth partially transmitting mirror enters an (n+1)th partially transmitting mirror, light reflected by the nth partially transmitting mirror is guided to the illuminating optical system through an (n−1) th partially transmitting mirror, an (n−2)th partially transmitting mirror, . . . , the first partially transmitting mirror, and light transmitted through a seventh partially transmitting mirror is reflected by the totally reflecting mirror, and guided to the illuminating optical system through the seventh partially transmitting mirror, the sixth partially transmitting mirror, . . . , the first partially transmitting mirror.

9. The method according to claim 7, wherein the reflectance Rn of the nth partially transmitting mirror is that R1=0.40±0.03, R2=0.07±0.03, R3=0.085±0.03, R4=0.095±0.03, R5=0.125±0.03, R6=0.017±0.03, and R7=0.25±0.03.

10. The method according to claim 1, wherein modulation of the pulse laser beam is performed such that when the non-single-crystal semiconductor film is irradiated with the pulse laser beam, a unitary crystal nucleus is generated in at least a portion of the non-single-crystal semiconductor film, and a crystal two-dimensionally grows from the unitary crystal nucleus.

11. An apparatus of crystallizing a semiconductor film comprising:
- a laser oscillator which oscillates a pulse laser beam;
- optical splitting/synthesizing means for splitting the oscillated pulse laser beam, and synthesizing the split pulse laser beams after the split pulse laser beams have propagated through optical paths different in optical path length;
- a phase modulating element which modulates the synthesized pulse laser beam into a pulse laser beam having a predetermined light intensity distribution; and
- an image forming optical system which irradiates a non-single-crystal film with the pulse laser beam having the predetermined light intensity distribution, wherein the optical splitting/synthesizing means for splitting the pulse laser beam and synthesizing the split pulse laser beams includes at least three optical splitting/synthesizing means, one of the split pulse laser beams is sequentially split by downstream splitting/synthesizing means, the other one of the split pulse laser beams is returned to upstream splitting/synthesizing means, and synthesized with the other one of the split pulse laser beams.

12. The apparatus according to claim 11, wherein the optical splitting/synthesizing means includes three to twelve optical splitting/synthesizing means.

* * * * *